(12) United States Patent
Kim

(10) Patent No.: US 7,524,749 B2
(45) Date of Patent: Apr. 28, 2009

(54) METALLIZATION METHOD OF SEMICONDUCTOR DEVICE

(75) Inventor: Jung Joo Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 220 days.

(21) Appl. No.: 11/318,589

(22) Filed: Dec. 28, 2005

(65) Prior Publication Data

US 2006/0148238 A1    Jul. 6, 2006

(30) Foreign Application Priority Data

Dec. 31, 2004    (KR) .............. 10-2004-0117695

(51) Int. Cl.
*H01L 21/44*    (2006.01)
(52) U.S. Cl. .............. 438/597; 257/E21.584; 438/653; 438/656
(58) Field of Classification Search .............. 438/643, 438/597, 627, 653, 656; 257/E21.584
See application file for complete search history.

(56) References Cited

U.S. PATENT DOCUMENTS

| | | | |
|---|---|---|---|
| 6,086,947 A * | 7/2000 | Clarke | 427/126.1 |
| 6,297,555 B1 * | 10/2001 | Zhao et al. | 257/758 |
| 2004/0253807 A1 * | 12/2004 | Thei et al. | 438/627 |

\* cited by examiner

*Primary Examiner*—Asok K Sarkar
(74) *Attorney, Agent, or Firm*—Finnegan, Henderson, Farabow, Garrett, & Dunner L.L.P.

(57) ABSTRACT

A method for forming a metallization contact in a semiconductor device includes (a) forming an insulating layer on a semiconductor substrate including an active device region or a lower metal wire; (b) forming a contact hole to expose a portion of the active device region or lower metal wire by etching a portion of the insulating layer; (c) depositing a first TiN layer on the insulating layer and inside the contact hole by a PVD process using a first carrier gas composition of nitrogen ($N_2$) and argon (Ar); (d) depositing a second TiN layer on the first TiN layer by a PVD process using a second carrier gas composition of nitrogen ($N_2$) and argon (Ar); and (e) forming a metal layer on the second TiN layer.

7 Claims, 2 Drawing Sheets

METALLIZATION METHOD OF SEMICONDUCTOR DEVICE

This application claims the benefit of priority of Korean Application No. 10-2004-0117695, filed on Dec. 31, 2004, which is incorporated by reference herein in its entirety.

BACKGROUND OF THE INVENTION

1. Field of the Invention

The present invention relates generally to semiconductor device manufacturing technology, and particularly to a method for forming a metallization contact in a semiconductor device.

2. Description of the Related Art

Thin film aluminum and aluminum alloys are fundamental materials having application in the semiconductor integrated circuits industry. Aluminum is a good conductor, and adheres well to silicon and silicon dioxide. A significant problem in using aluminum for interconnects is junction spiking, which occurs at the interface of pure aluminum and silicon. This problem worsens when the interface is heated during commonly performed heat treatments, such as annealing, due to the change of the solubility of silicon aluminum with temperature. Junction spiking results in current leakage when the aluminum is a contact to a p-n junction. If aluminum penetrates beyond the p-n junction depth below the contact, the junction will be electrically shorted.

One technique to address to this challenge is to use a barrier metal structure, i.e., titanium/titanium nitride (Ti/TiN) double layer structure, as underlying layers for aluminum or aluminum alloy metallization contacts on silicon-based devices, in order to prevent the interdiffusion of aluminum and silicon, and to obtain a good ohmic contact at the interface thereof.

FIG. 1 shows a conventional method for forming a metallization contact. An insulating layer is formed on a semiconductor substrate 1 and etched to form a contact hole (not numbered) exposing an active region 2 of substrate 1. Reference numeral 2' denotes a remaining portion of the insulating layer. A titanium (Ti) layer 3 is then deposited to cover insulating layer 2' and active region 2 and a titanium nitride (TiN) layer 5 is deposited on Ti layer 3 in an nitrogen (N) atmosphere. An aluminum layer 6 is deposited on TiN layer 5 to form a metal wiring. Because titanium reacts with silicon in active region 2 to form titanium silicide ($TiSi_x$, generally $TiSi_2$), a diffusion barrier having a structure of $TiSi_2$/Ti/TiN is formed.

In the conventional aluminum metallization with the aforementioned diffusion barrier structure, the Ti and TiN layers are deposited by physical vapor deposition (PVD) sputtering method. However, PVD sputtering generally has inferior step coverage ability, and cannot provide adequate film thickness along the sidewalls of the contact hole. In particular, when an aspect ratio (i.e., the ratio of height-to-diameter) of the contact hole rises to be about 1, as integration of the device is increased, the step coverage of Ti/TiN decreases to be less than about 40%. Owing to the inferior step coverage, the electric resistivity of the metal wire increases during the operation of the device, resulting in decrease of the operational speed of the device, and over time, a short circuit condition between the active region of the substrate and the metal wire in the long run. In addition, the inferior step coverage of PVD may disturb the subsequent deposition of aluminum or aluminum alloys in the contact hole. Specifically, Ti/TiN deposited in the contact hole by PVD may have a negative slope, i.e., Ti/TiN deposited near a top corner of the contact hole is thicker than Ti/TiN deposited near a bottom corner of the contact hole, as shown in FIG. 1. As a result, subsequently deposited aluminum cannot provide sufficient coverage in the contact.

As an alternative to aluminum contacts, tungsten (W) has been used to form contacts, often referred to as "tungsten plugs." Referring to FIG. 2, a contact hole (not numbered) is formed by etching a predetermined portion of an insulating layer 11 formed on substrate 10. A tungsten plug is formed in the contact hole. A TiN layer 12 is used as the barrier for the tungsten plug. In contrast with the above explained aluminum metallization, TiN barrier 12 is formed by a chemical vapor deposition (CVD) using TDMAT (Tetrakis Dimethylamino Titanium) as a source. Thus, the tungsten plug formation process does not incur junction spiking. Although the CVD TiN process has superior step coverage ability, however, certain precursor chemicals are required to initiate the formation of the TiN. Such precursor chemicals introduce a large quantity of impurities, e.g., carbon, into TiN layer 12. Carbon may diffuse into a silicon substrate 10, thus increasing the electric resistivity of the contacts.

Most impurities can be removed by plasma treatment, but plasma ions cannot reach the lower part of the sidewalls of the contact hole. The impurities in the lower part of TiN layer 12 on the sidewalls may result in the degradation of step coverage of the subsequent tungsten deposition process. FIG. 2 shows a void in the tungsten plug formed in the contact hole due to the nonuniformity in TiN layer 12. As a result, contact resistance increases and device reliability decreases.

SUMMARY OF THE INVENTION

Consistent with the present invention, there is provided a method for forming a metallization contact in a semiconductor device. The metallization contact has a bilayer TiN structure having improved barrier characteristics against the diffusion of impurities. The bilayer TiN structure also enables superior step coverage and gap-fill properties in metal deposition.

A method for forming a metallization contact in a semiconductor device, consistent with an embodiment of the present invention, includes the steps of: (a) forming an insulating layer on a semiconductor substrate including an active device region or a lower metal wire; (b) forming a contact hole to expose a portion of the active device region by etching a portion of the insulating layer; (c) depositing a first TiN layer on the insulating layer and inside the contact hole by a PVD process using a first carrier gas composition of nitrogen ($N_2$) and argon (Ar); (d) depositing a second TiN layer on the first TiN layer by a PVD process using a second carrier gas composition of nitrogen ($N_2$) and argon (Ar); and (e) forming a metal layer on the second TiN layer.

In one aspect, the semiconductor substrate includes an active region, the metallization contact connects the metal layer and the active region, and the first carrier gas composition preferably has a lower ratio of $N_2$-to-Ar than the second carrier gas composition. In another aspect, the semiconductor substrate includes a lower metal wire, the metallization contact connects the metal layer and the lower metal wire, and the first carrier gas composition preferably has a higher ratio of $N_2$-to-Ar than the second carrier gas composition.

These and other aspects of the invention will become evident by reference to the following description of the invention, often referring to the accompanying drawings.

BRIEF DESCRIPTION OF DRAWINGS

The accompanying drawings, which are incorporated in and constitute a part of this specification, illustrate embodiments of the invention and, together with the description, serve to explain the features, advantages, and principles of the invention.

In the drawings.

DETAILED DESCRIPTION OF THE INVENTION

Reference will now be made in detail to the present embodiments of the invention, examples of which are illustrated in the accompanying drawings. Wherever possible, the same reference numbers will be used throughout the drawings to refer to the same or like parts.

Figure 1:
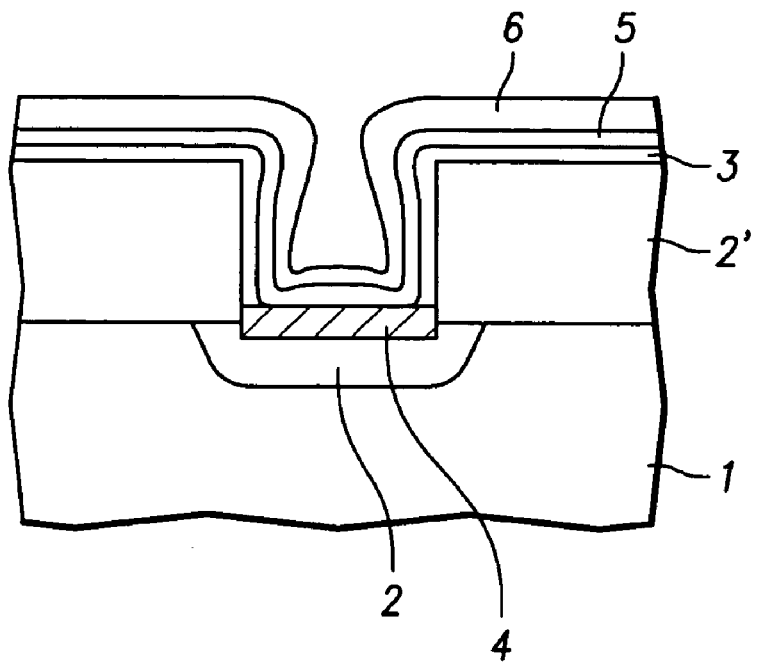
FIG. 1 is a cross-sectional view of a metallization contact structure, illustrating a conventional method of forming aluminum metallization contacts using PVD sputtering.
Figure 2:
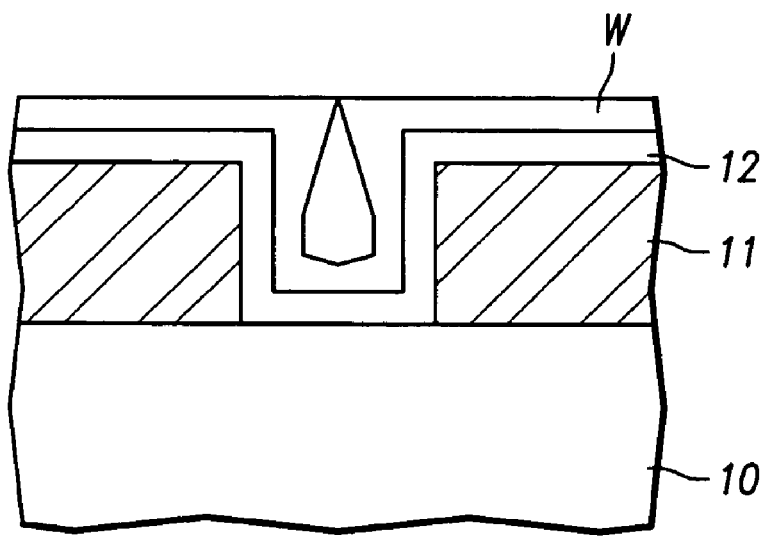
FIG. 2 is a cross-sectional view of a metallization contact structure, illustrating a conventional method of forming tungsten metallization contacts using CVD sputtering.
Figure 3:
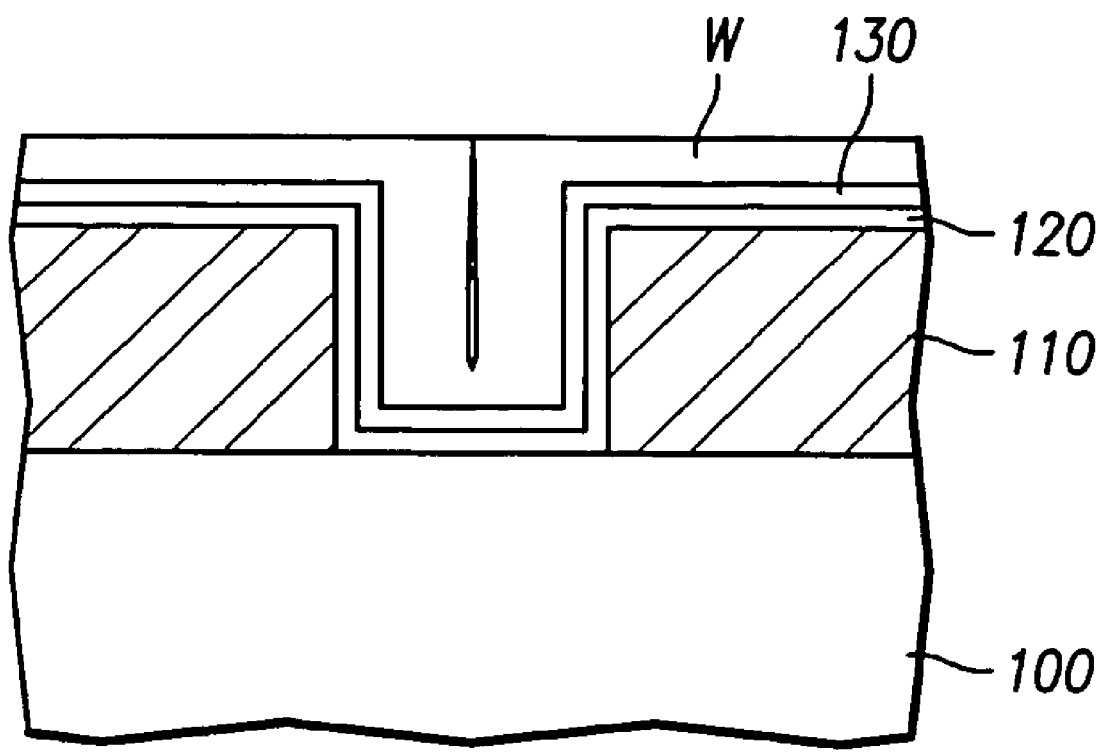
FIG. 3 is a cross-sectional view of a metallization contact structure, illustrating a method for forming a metallization contact in a semiconductor device, consistent with an embodiment of the present invention.

FIG. 3 illustrates an exemplary contact structure utilizing a bilayer TiN barrier structure with a tungsten contact layer. The bilayer TiN structure comprises two TiN layers having different densities deposited by PVD.

Referring to FIG. 3, a contact hole (or via hole, not numbered) is formed by etching a predetermined portion of an insulating layer 110 formed on a silicon substrate 100. The contact hole exposes a portion of an active region of substrate 100. TiN layers 120 and 130 are then formed over the entire surface of substrate 100 by PVD process using ionized metal plasma (IMP) and a mixed gas of nitrogen ($N_2$) and argon (Ar).

Before the formation of TiN layers 120 and 130, a Ti layer can be first formed to improve TiN adhesion. A pure Ti target may be used to deposit the titanium layer inan argon (Ar) atmosphere. Subsequent to the formation of the initial Ti layer, TiN layers 120 and 130 are IMP-sputtered on substrate 100 with the carrier gas composition of $N_2$/Ar. Nitrogen gas ($N_2$) can react with the Ti target and form a layer of TiN on the surface of the target. Such a mode of deposition is often defined as the "nitrided" or "poisoned" mode of TiN deposition, since the Ti target is "poisoned." TiN is bombarded off the target by Ar sputtering, and is then deposited on substrate 100, forming TiN layer 120 or 130.

In the "poisoned mode" of IMD sputtering, if the carrier gas composition has a relatively low ratio of $N_2$-to-Ar, the deposited TiN has a relatively dense structure. In order to improve the barrier characteristics of the PVD TiN layers, the PVD TiN layers are formed in different densities by controlling the carrier gas composition.

In case of forming a contact for interconnects with polysilicon or silicon in the active regions, TiN layer 120 is deposited using a carrier gas composition having a relatively low ratio of $N_2$-to-Ar, and TiN layer 130 is deposited using a carrier gas composition having a relatively high ratio of $N_2$-to-Ar. A denser TiN layer is a better barrier in preventing diffusion therethrough. Therefore, TiN layer 120 can act as an enhanced barrier against the diffusion of silicon from the active regions into the metallization layer. Alternatively and not shown in FIG. 3, the bilayer PVD TiN structure may also be used in forming contact for interconnects between metal wirings, in which case TiN layer 120 is deposited using a carrier gas composition having a relatively high ratio of $N_2$-to-Ar, and TiN layer 130 is deposited using a carrier gas composition having a relatively low ratio of $N_2$-to-Ar. The denser TiN layer 130 can act as an enhanced barrier against the diffusion of metal particles from an upper metallization layer into a lower metallization layer. Thus, TiN bilayer consisting of a denser TiN layer and a sparser TiN layer can more effectively prevent the diffusion of impurities between two layers.

After the formation of the bilayer PVD TiN strucrure including TiN layers 120 and 130, a metal, such as tungsten (W) or aluminum, is deposited over the entire surface of substrate 100 and in the contact hole to form a metal wire. The bilayer PVD TiN structure provides an appropriate thickness of TiN on the sidewall of the contact hole, so that the deposition of the metal has a good step coverage and satisfactory gap filling characteristics. In addition, the PVD TiN bilayer may efficiently suppress diffusion of impurities.

While the invention has been shown and described with reference to certain embodiments thereof, it will be understood by those skilled in the art that various changes in form and details may be made therein without departing from the spirit and scope of the invention as defined by the appended claims.

What is claimed is:

1. A method for forming a metallization contact in a semiconductor device, comprising the steps of:

forming an insulating layer over a semiconductor substrate including an active device region or a lower metal wire;

forming a contact hole to expose a portion of the active device region or lower metal wire by etching a portion of the insulating layer;

depositing a first TiN layer on the insulating layer and inside the contact hole by a PVD process using a first carrier gas composition of nitrogen ($N_2$) and argon (Ar), the first TiN layer having a first density controlled by the first carrier gas composition;

depositing a second TiN layer directly on the first TiN layer by a PVD process using a second carrier gas composition of nitrogen ($N_2$) and argon (Ar), the second TiN layer having a second density controlled by the second carrier gas composition; and forming a metal layer on the second TiN layer, wherein the second carrier gas composition has an $N_2$-to-Ar ratio different from that of the first carrier gas composition.

2. The method of claim 1, wherein the semiconductor substrate includes an active region, the metallization contact connects the metal layer and the active region, and the first carrier gas composition has a lower ratio of $N_2$-to-Ar than the second carrier gas composition.

3. The method of claim 1, further comprising, before depositing the first TiN layer, forming a titanium layer over the insulating layer in an argon atmosphere.

4. The method of claim 1, wherein the semiconductor substrate includes a lower metal wire, the metallization contact connects the metal layer and the lower metal wire, and the first carrier gas composition has a higher ratio of $N_2$-to-Ar than the second carrier gas composition.

5. The method of claim 2, wherein the first density is greater than the second density.

6. The method of claim 1, wherein forming the metal layer comprises forming tungsten or aluminum.

7. The method of claim 4, wherein the second density is greater than the first density.

* * * * *